(12) United States Patent
Kim et al.

(10) Patent No.: US 12,295,264 B2
(45) Date of Patent: May 6, 2025

(54) THERMOELECTRIC MODULE AND METHOD FOR MANUFACTURING THE SAME

(71) Applicant: SAMSUNG ELECTRO-MECHANICS CO., LTD., Suwon-si (KR)

(72) Inventors: Sung Han Kim, Suwon-si (KR); Se Yeon Hwang, Suwon-si (KR); Joon Woo Gi, Suwon-si (KR); Jong Ho Chung, Suwon-si (KR); Han Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 4 days.

(21) Appl. No.: 17/741,352

(22) Filed: May 10, 2022

(65) Prior Publication Data

US 2023/0180610 A1    Jun. 8, 2023

(30) Foreign Application Priority Data

Dec. 7, 2021 (KR) .................. 10-2021-0173874

(51) Int. Cl.
*H10N 10/17* (2023.01)
*H10N 10/01* (2023.01)
*H10N 10/855* (2023.01)

(52) U.S. Cl.
CPC ........... *H10N 10/17* (2023.02); *H10N 10/01* (2023.02); *H10N 10/855* (2023.02)

(58) Field of Classification Search
CPC .................... H10N 10/17; H10N 10/855
See application file for complete search history.

(56) References Cited

U.S. PATENT DOCUMENTS

| | | | |
|---|---|---|---|
| 6,620,994 B2 | 9/2003 | Rossi | |
| 8,669,635 B2 * | 3/2014 | Hiroshige | H10N 10/856 |
| | | | 977/932 |

(Continued)

FOREIGN PATENT DOCUMENTS

| | | |
|---|---|---|
| JP | 2011-199091 A | 10/2011 |
| KR | 10-2013-0056699 A | 5/2013 |

(Continued)

OTHER PUBLICATIONS

Machine translation of KR 10-2021-0020461 (Year: 2021).*

(Continued)

*Primary Examiner* — Tamir Ayad
(74) *Attorney, Agent, or Firm* — MORGAN, LEWIS & BOCKIUS LLP

(57) ABSTRACT

A thermoelectric module includes a stack structure of a plurality of insulating layers, a plurality of thermoelectric elements formed with the insulating layer interposed therebetween and including a first-type semiconductor device, a second-type semiconductor device, a first electrode connected to the first-type semiconductor device, a second electrode connected to the second-type semiconductor device, and a connection electrode connecting the first-type and second-type semiconductor devices, and a conductive via penetrating through the insulating layer to connect thermoelectric elements adjacent to each other, among the plurality of thermoelectric elements.

21 Claims, 13 Drawing Sheets

(56) References Cited

U.S. PATENT DOCUMENTS

2010/0212713 A1* 8/2010 Sasaki .................... H10N 10/01
    156/60
2018/0248097 A1   8/2018 Hayashi et al.
2021/0057627 A1* 2/2021 Uchiyama .............. H10N 10/81

FOREIGN PATENT DOCUMENTS

| KR | 10-2013-0073554 A | | 7/2013 | | |
|---|---|---|---|---|---|
| KR | 10-1324257 B1 | | 11/2013 | | |
| KR | 2020037631 A | * | 4/2020 | ............ | H01L 35/04 |
| KR | 10-2021-0020461 A | | 2/2021 | | |

OTHER PUBLICATIONS

Machine translation of KR-2020037631-A (Year: 2020).*
Office Action issued in corresponding Korean Patent Application No. 10-2021-0173874 dated Nov. 10, 2022, with English abstract.

* cited by examiner

THERMOELECTRIC MODULE AND METHOD FOR MANUFACTURING THE SAME

CROSS-REFERENCE TO RELATED APPLICATION(S)

This application claims benefit of priority to Korean Patent Application No. 10-2021-0173874 filed on Dec. 7, 2021 in the Korean Intellectual Property Office, the disclosure of which is incorporated herein by reference in its entirety.

BACKGROUND

1. Field

The present disclosure relates to a thermoelectric module and a method for manufacturing the same.

2. Description of Related Art

A thermoelectric phenomenon may be divided into two technologies: a cooling technology using the Peltier effect and an energy harvesting technology using the Seebeck effect. Both technologies may be considered to be important enough to determine the rise or fall of companies in the future. In particular, the problems of global warming and energy depletion due to the rapid increase in the use of fossil fuels at this point have accelerated research on the development of new renewable energy. In addition, all of the equipment and electronic devices dissipate most of input energy in the form of heat.

Therefore, reuse of waste heat energy and application thereof to new areas will be a good methodology to overcome the energy crisis. As an example, a lot of research has been conducted around the world to reproduce, as electrical energy, waste heat of automobiles and a lot of waste heat given off by waste incinerators, steel mills, power plants, geothermal heat, electronic devices, body warmth, etc.

In particular, thermoelectric power generation is volumetric power generation and may be combined with other power generation, which is a biggest strength in terms of application in the future. In a cooling field, the amount of generated heat has increased due to the miniaturization, high power, high integration, and slimming of electronic components along with the development of the IT industry, and the generated heat acts as an important factor reducing a malfunction and efficiency of electronic devices. To solve these problems, thermoelectric modules have been used, and if the functions such as noiselessness, fast cooling speed, and local cooling of thermoelectric modules are fully utilized, applicability of the thermoelectric modules may further increase.

A thermoelectric module of the related art is formed by repeating a single module including an n-type semiconductor, a P-type semiconductor, and each single module is connected to a metal electrode, and the metal electrode is connected to the ceramic substrate.

However, the thermoelectric module of the related art has limitations in high integration and miniaturization, has weak shear strength compared to compressive strength, and cracks may occur in the metal electrode connected to the ceramic substrate due to repeated thermal stress, or junction delamination occurs. In addition, there is a need to improve the performance of the thermoelectric module due to oxidation when the thermoelectric module operates at a high temperature.

SUMMARY

Exemplary embodiments are to implement a chip-type thermoelectric module to achieve high integration and miniaturization of the thermoelectric module.

Exemplary embodiments are to prevent defects such as cracks and joint separation by improving mechanical strength of a thermoelectric module.

Exemplary embodiments are to solve a problem in which the performance of a thermoelectric module is deteriorated at a high temperature.

However, the aspect of the present disclosure is not limited to the above, and will be more easily understood in the course of describing specific exemplary embodiments in the present disclosure.

According to an aspect of the present disclosure, a thermoelectric module may include a stack structure of a plurality of insulating layers, a plurality of thermoelectric elements formed with the insulating layer interposed therebetween and including a first-type semiconductor device, a second-type semiconductor device, a first electrode connected to the first-type semiconductor device, a second electrode connected to the second-type semiconductor device, and a connection electrode connecting the first-type and second-type semiconductor devices, and a conductive via penetrating through the insulating layer to connect thermoelectric elements adjacent to each other, among the plurality of thermoelectric elements.

According to another aspect of the present disclosure, a method for manufacturing a thermoelectric module may include preparing a ceramic green sheet on which a plurality of vias are formed, filling the vias with a conductive paste to form conductive vias, forming a plurality of thermoelectric elements at certain intervals on the ceramic green sheet, stacking the ceramic green sheet on which the plurality of thermoelectric elements are formed to form a stack, and cutting the stack into regions each corresponding to one thermoelectric module and sintering the cut region to form a stack structure of a plurality of insulating layers, wherein the forming of the thermoelectric elements may include forming first-type and second-type semiconductor devices and forming a first electrode connected to the first-type semiconductor device, a second electrode connected to the second-type semiconductor device, and a connection electrode connecting the first-type and second-type semiconductor devices.

According to still another aspect of the present disclosure, a thermoelectric module may include a ceramic body including first and second thermoelectric elements and an insulating layer interposed therebetween in a stacking direction, in which each of the first and second thermoelectric elements comprises a first-type semiconductor device, a second-type semiconductor device, a first electrode connected to the first-type semiconductor device, a second electrode connected to the second-type semiconductor device, and a connection electrode connecting the first-type and second-type semiconductor devices, the first and second thermoelectric elements are electrically connected to each other in series, the first-type semiconductor device of the first thermoelectric element overlaps the second-type semiconductor device of the second thermoelectric element in the stacking direction, and the second-type semiconductor device of the first thermoelectric element overlaps the first-type semiconductor device of the second thermoelectric element in the stacking direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
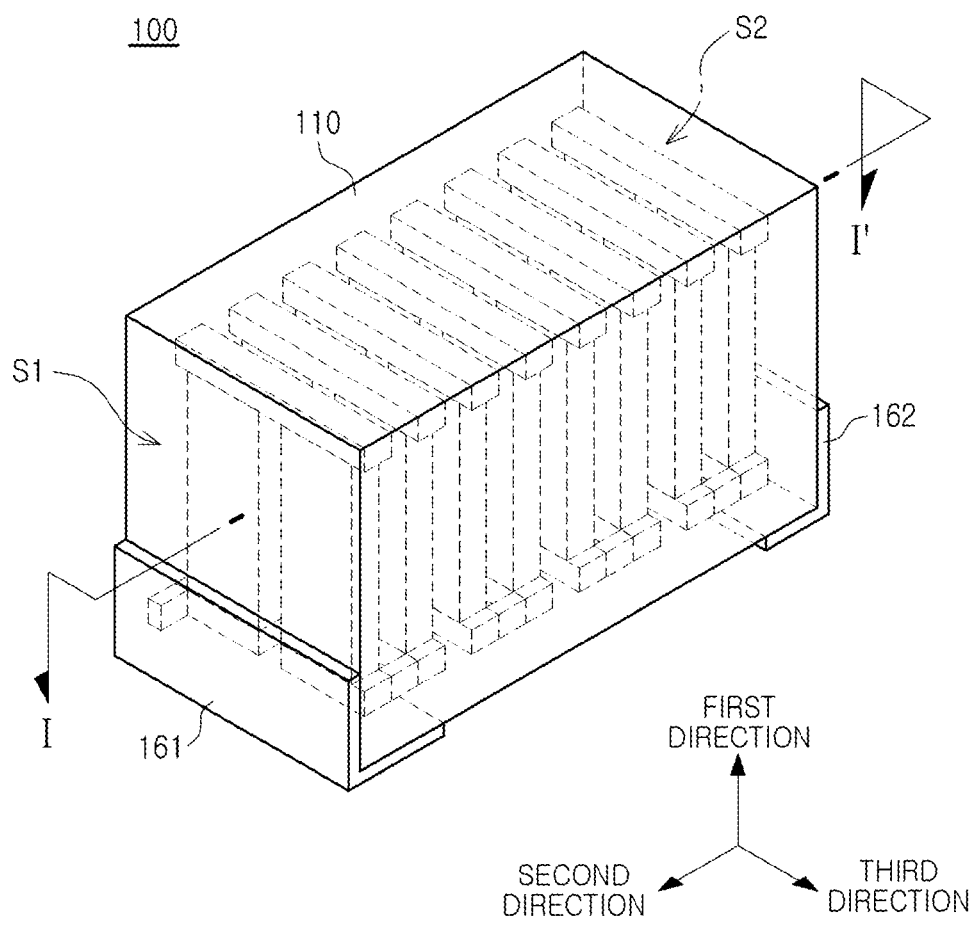
FIG. 1 is a perspective view schematically illustrating a thermoelectric module according to an exemplary embodiment in the present disclosure.
Figure 2:
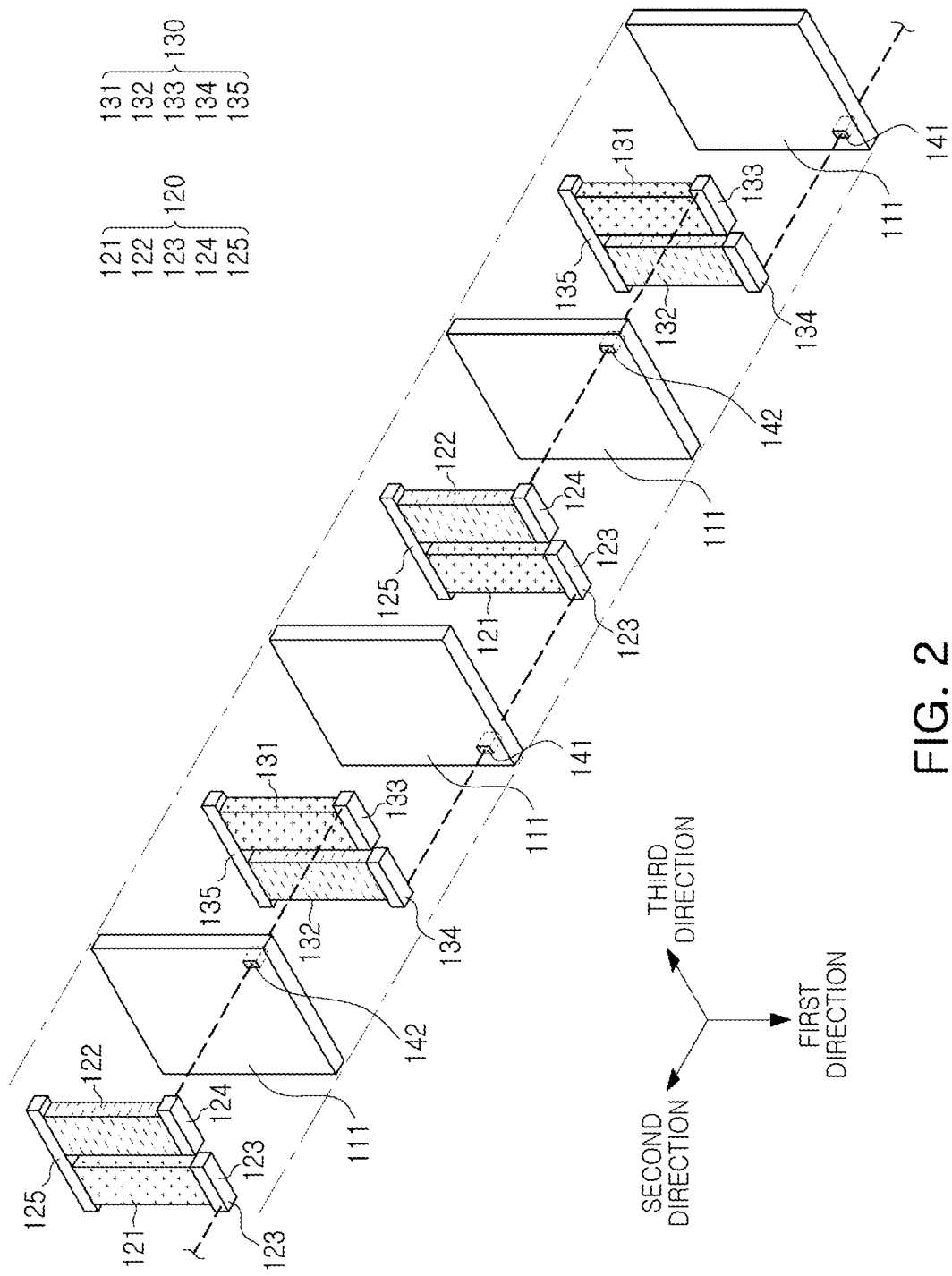
FIG. 2 is an exploded perspective view of a stack structure of an insulating layer and a thermoelectric element of a thermoelectric module according to an exemplary embodiment in the present disclosure.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

To clarify the present invention, portions irrespective of description are omitted and like numbers refer to like elements throughout the specification, and in the drawings, the thickness of layers, films, panels, regions, etc., are exaggerated for clarity. Also, in the drawings, like reference numerals refer to like elements although they are illustrated in different drawings.

In the drawings, a first direction may be defined as a thickness (T) direction, a second direction may be defined as a length (L) direction or a stacking direction, and a third direction may be defined as a width (W) direction.

Hereinafter, a thermoelectric module according to an exemplary embodiment in the present disclosure will be described in detail with reference to FIGS. 1 to 5B.

A thermoelectric module 100 according to an exemplary embodiment in the present disclosure includes a stack structure 110 of a plurality of insulating layers 111, a plurality of thermoelectric elements 120 and 130 formed with the insulating layer 111 interposed therebetween and including first-type semiconductor devices 121 and 131, second-type semiconductor devices 122 and 132, first electrodes 123 and 133 connected to the first-type semiconductor devices, second electrodes 124 and 134 connected to the second-type semiconductor devices, and connection electrodes 125 and 135 connecting the first-type and second-type semiconductor devices 121, 131, 122 and 132, and conductive vias 141 and 142 penetrating through the insulating layer 111 to connect thermoelectric elements adjacent to each other, among the plurality of thermoelectric elements 120 and 130.

The insulating layer 111 is not particularly limited as long as sufficient insulating properties may be obtained by including a material having insulating properties. The insulating layer 111 serves to separate the adjacent thermoelectric elements 120 and 130 from each other, and the thermoelectric elements 120 and 130 disposed to be adjacent to each other may be connected by the conductive vias 141 and 142 penetrating through the insulating layer 111 as will be described later.

Since the thermoelectric elements 120 and 130 are hermetically sealed by the stack structure 110 of the plurality of insulating layers 111, the thermoelectric module 100 in which resistance to stress and/or thermal stress due to an external load may be improved, a degradation of performance due to oxidation of the thermoelectric elements 120 and 130 may be prevented, and which has excellent mechanical strength may be provided.

The insulating layer 111 may include a material that can be simultaneously sintered with a semiconductor slurry forming the first-type semiconductor devices 121 and 131 and the second-type semiconductor devices 122 and 132 and a conductive paste forming the first electrodes 123 and 133, and the second electrodes 124 and 134, the connection electrodes 125 and 136, and the conductive vias 141 and 142.

Accordingly, the insulating layer 111 may include low temperature co-fired ceramics (LTCCs) that are simultaneously sintered with the semiconductor slurry and the conductive paste. That is, the insulating layer 111 may be a ceramic sintered body, and more specifically, a low temperature co-fired ceramic sintered body.

Here, an average thickness of the insulating layer 111 may be arbitrarily changed according to a size of the thermoelectric module 100, and the thickness of the first layer may be configured to be 0.1 to 10 μm after sintering, but the present disclosure is not limited thereto.

The first-type semiconductor devices 121 and 131 and the second-type semiconductor devices 122 and 132 may be formed of different semiconductor materials. For example, the first-type semiconductor devices 121 and 131 may be formed of P-type semiconductor devices, and the second-type semiconductor devices 122 and 132 may be formed of N-type semiconductor device. In this case, the first-type semiconductor devices 121 and 131 and the second-type semiconductor devices 122 and 132 may form one unit cell.

The first-type semiconductor devices 121 and 131 and the second-type semiconductor devices 122 and 132 may be formed of known thermoelectric materials employed in the art, and, for example, one or more semiconductors including two or more elements selected from the group consisting of transition metals, rare earth elements, group 13 elements, group 14 elements, group 15 elements, and group 16 elements may be used. Y, Ce, La, etc. may be used as the rare earth elements, one or more of Ti, Zr, Hf, V, Nb, Ta, Cr, Mo, W, Mn, Fe, Co, Ni, Cu, Zn, Ag, and Re may be used as the transition metals, one or more of B, Al, Ga, and In may be used as the group 13 elements, one or more of C, Si, Ge, Sn, and Pb may be used as the group 14 elements, one or more of P, As, Sb, and Bi may be used as the group 15 elements, and one or more of S, Se, and Te may be used as the group 16 elements. Examples of semiconductors including such elements may include one or more selected from the group consisting of Bi—Te-based, Co—Sb-based, Pb—Te-based, Si—Ge-based, Fe—Si-based or Sb—Te-based semiconductors, and include, more preferably, Bi—Te-based semiconductor.

These semiconductors may include one or more elements selected from the group consisting of the transition metals, rare earth elements, group 13 elements, group 14 elements, group 15 elements, and group 16 elements as a dopant to improve electrical properties and the like. For example, the Bi—Te-based semiconductor may include at least one of $Bi_{0.8}Sb_{1.2}Te_3$, $Bi_{0.5}Sb_{1.5}Te_{2.7}Se_{0.3}$, $Bi_2Te_3$, $Bi_2Te_{2.39}Se_{0.6}$, and $Bi_2Se_3$ in which Sb and Se are used as dopants, but the present disclosure is not limited thereto.

The first electrodes 123 and 133 are connected to the first-type semiconductor devices 121 and 131, and the second electrodes 124 and 134 are connected to the second-type semiconductor devices 122 and 132. In addition, the first-type semiconductor devices 121 and 131 and the second-type semiconductor devices 122 and 132 are electrically connected to each other by the connection electrodes 125 and 135.

Here, the conductive vias 141 and 142 penetrating through the insulating layer 111 are connected to the first electrodes 123 and 133 and the second electrodes 124 and 134 adjacent to each other with the insulating layer 111 interposed therebetween to connect the thermoelectric elements 120 and 130 adjacent to each other, among the plurality of thermoelectric elements 120 and 130.

The conductive vias 141 and 142 may be disposed on the same plane as that of the insulating layer 111, thereby reducing a size of the thermoelectric module 100 and connecting the thermoelectric elements 120 and 130 adjacent to each other to the insulating layer 111 interposed therebetween. Each of the conductive vias 141 and 142 may not overlap the first-type and second-type semiconductor devices 121, 131, 122 and 132 in any of the first, second and third directions.

The first electrodes 123 and 133, the second electrodes 124 and 134, the connection electrodes 125 and 135, and the conductive vias 141 and 142 may include any one selected from the group consisting of Ag, Al, Cu, Ni, and alloys thereof.

The metal component has excellent electrical conductivity, and in particular, nickel (Ni) may effectively suppress migration of the semiconductor device that may occur between the first-type semiconductor devices 121 and 131 and the second-type semiconductor devices 122 and 132. In addition, since silver (Ag) and aluminum (Al) may be sintered at a relatively low temperature, silver (Ag) and aluminum (Al) may be easily co-sintered with the thermoelectric material forming the first and second-type semiconductor devices.

The thermoelectric elements 120 and 130 may be co-sintered with the insulating layer 111, and as described above, the materials forming the first and second-type semiconductor devices and metal components forming the first and second electrodes and the connection electrode may be appropriately selected to be simultaneously sintered with the insulating layer 111.

The number of stacks of the thermoelectric elements 120 and 130 may be determined according to a size and purpose of the thermoelectric module 100. For example, 10 or more thermoelectric elements, or 100 or more thermoelectric elements may be stacked, but the present disclosure is not limited thereto.

An average thickness of the thermoelectric elements 120 and 130 may be determined according to a size of the thermoelectric module 100 and the number of stacked thermoelectric elements 120 and 130. For example, the average thickness of the thermoelectric elements 120 and 130 may be determined to be in the range of 0.1 to 1.0 μm, but the present disclosure is not limited thereto.

Figure 3:
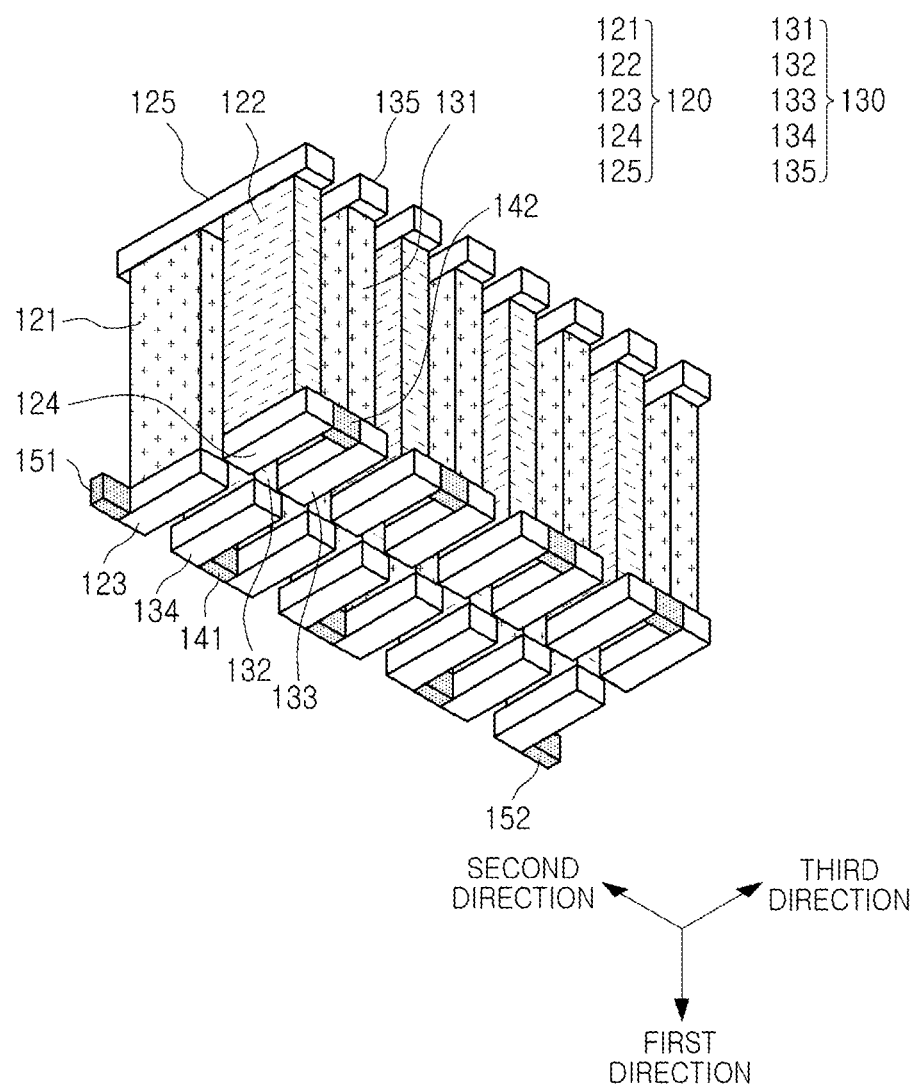
FIG. 3 is a perspective view illustrating a structure of a thermoelectric element and a conductive via of a thermoelectric module according to an exemplary embodiment in the present disclosure.
Figure 4:
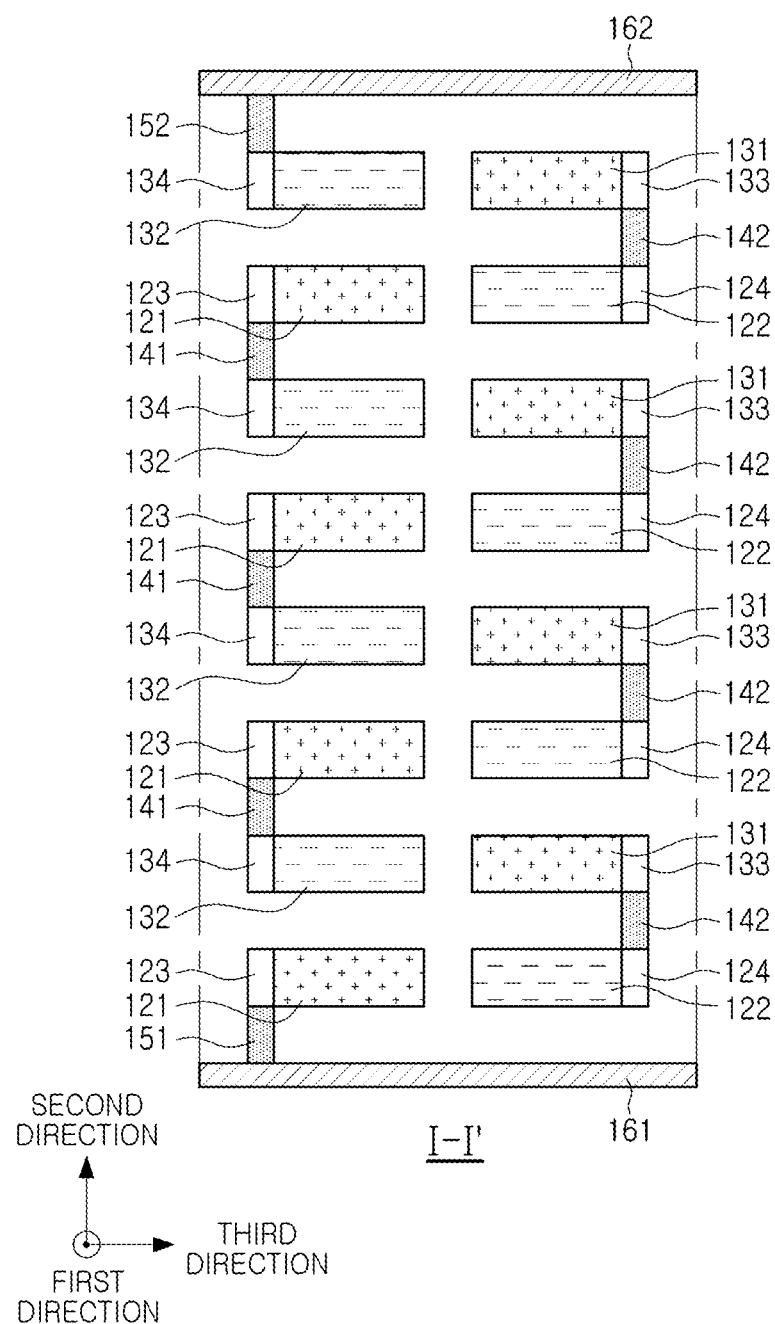
FIG. 4 is a cross-sectional view taken along line I-I' of FIG. 1.
Figure 5A:
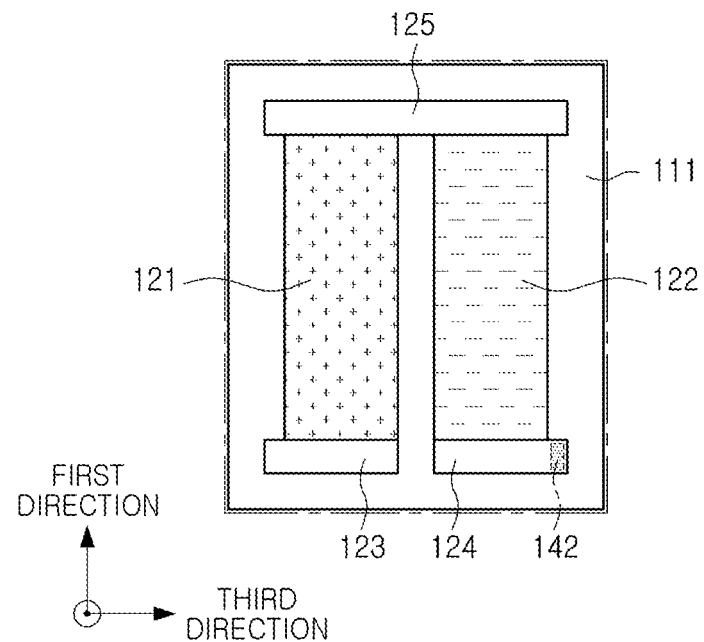
FIGS. 5A and 5B are plan views illustrating a thermoelectric element of a thermoelectric module and a conductive via connected to the thermoelectric element in one plane according to an exemplary embodiment in the present disclosure.
Figure 5B:
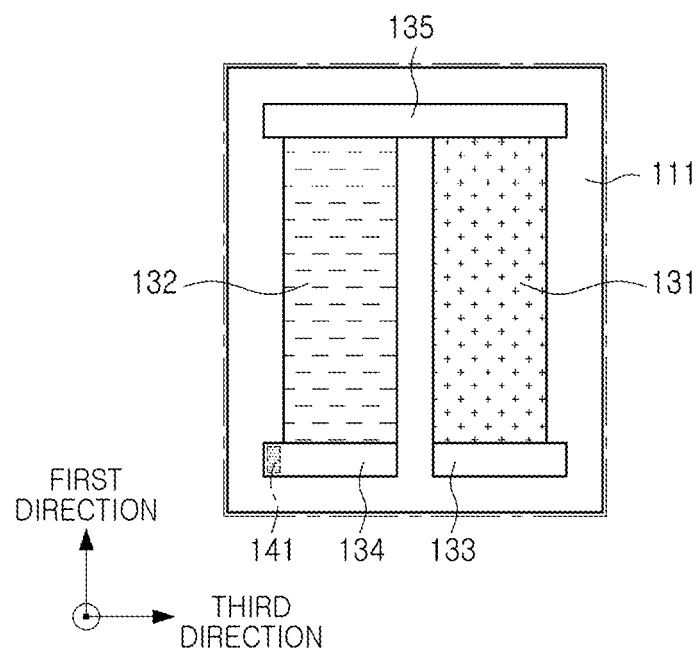

The plurality of thermoelectric elements may include the first thermoelectric element 120 and the second thermoelectric element 130 adjacent to each other with the insulating layer 111 interposed therebetween. Referring to FIGS. 3 and 4, the first conductive via 141 may connect the first electrode 123 of the first thermoelectric element 120 and the second electrode 134 of the second thermoelectric element 130. Also, the second conductive via 142 may connect the second electrode 124 of the first thermoelectric element 120 and the first electrode 133 of the second thermoelectric element 130.

When power is supplied to the thermoelectric module 100 according to an exemplary embodiment in the present disclosure, a side in which current flows from the first-type semiconductor devices 121 and 131 to the second-type semiconductor devices 122 and 132 may evolve heat and a side in which current flows from the second-type semiconductor devices 122 and 132 to the first-type semiconductor devices 121 and 131 may absorb heat due to the Peltier effect.

That is, when power is supplied to the thermoelectric module 100, the P-type semiconductor device and the N-type semiconductor device are electrically connected in series so that a current flows, and holes in the P-type semiconductor device may move with heat toward the (−) side and the electrons in the N-type semiconductor device may move with heat toward the (+) side, so that the lower surface, among the upper surface and the lower surface of the thermoelectric module 100 facing each other in the first direction, may be cooled and the upper surface may be heated.

According to an exemplary embodiment in the present disclosure, the first-type semiconductor device 121 of the first thermoelectric element 120 may overlap the second-type semiconductor device 132 of the second thermoelectric element 130 in the stacking direction of the plurality of insulating layers 111, and the second-type semiconductor device 122 of the first thermoelectric element 120 may overlap the first-type semiconductor device 131 of the second thermoelectric element 130 in the stacking direction of the plurality of insulating layers 111.

That is, based on the stacking direction, the first-type semiconductor devices 121 and 131 and the second-type semiconductor devices 122 and 132 may be alternately disposed. According to this structure, in the thermoelectric module 100 according to an exemplary embodiment in the present disclosure, the number of stacked thermoelectric elements 120 and 130 may be increased in the same volume and a higher level of series connection may be implemented in the same volume.

According to an exemplary embodiment in the present disclosure, the thermoelectric module 100 may further include first and second external electrodes 161 and 162 disposed on the first surface S1 and the second surface S2 of the stack structure 110 of the plurality of insulating layers 111 facing each other in the stacking direction. The plurality of thermoelectric elements 120 and 130 may be electrically connected to the outside by the first and second external electrodes 161 and 162.

In this case, the first and second external electrodes 161 and 162 may extend to a lower surface of the stack structure 110 in consideration of mounting convenience. The lower surface of the stack structure 110 may refer to a mounted surface, among both surfaces facing each other in the first direction.

The first and second external electrodes 161 and 162 may be formed of one of silver (Ag), lead (Pb), platinum (Pt), nickel (Ni), and copper (Cu) or alloys thereof, but the present disclosure is not limited thereto.

In addition, the first and second external electrodes 161 and 162 may be formed of a plurality of layers, and a plating layer may be further formed on the external electrodes to improve mounting characteristics.

Here, referring to FIG. 4, the thermoelectric module 100 according to an exemplary embodiment in the present disclosure may further include a first connection via 151 penetrating through the insulating layer 111 to connect the first electrodes 123 and 133 to the first external electrode 161 and a second connection via 152 penetrating through the insulating layer 111 to connect the second electrodes 124 and 134 to the second external electrode 162.

The first and second connection vias 151 and 152 may include the same metal component as that of the first and second conductive vias 141 and 142 and may be formed by the same method, but the present disclosure is not limited thereto.

Unlike the conductive vias 141 and 142 connecting the thermoelectric elements 120 and 130 disposed adjacent to each other with the insulating layer 111 interposed therebetween, the connection vias 151 and 152 may connect the first electrodes 123 and 133 disposed at the outermost portion in the second direction (stacking direction) to the external electrode 161 and connect the second electrodes 124 and 134 disposed at the outermost portion in the second direction (stacking direction) to the second external electrode 162.

Meanwhile, referring to FIG. 4, the first and second connection vias 151 and 152 are disposed to overlap the first conductive via 141 in the stacking direction, but the present disclosure is not limited thereto and the first and second connection vias 151 and 152 may be disposed to overlap the second conductive via 142 in the stacking direction.

Figure 6A:
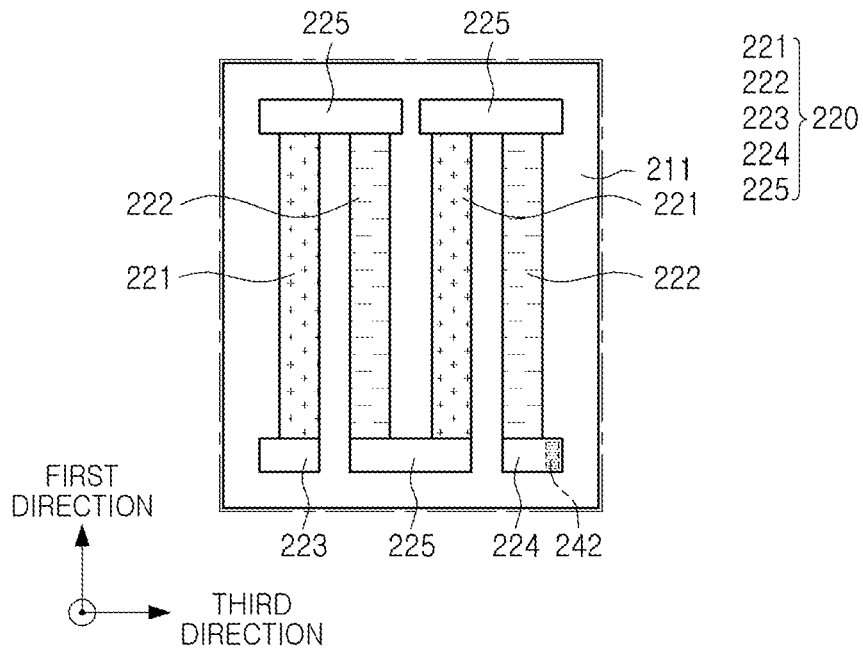
FIGS. 6A and 6B are plan views illustrating a thermoelectric element of a thermoelectric module according and a conductive via connected to the thermoelectric element in one plane to an exemplary embodiment in the present disclosure.
Figure 6B:
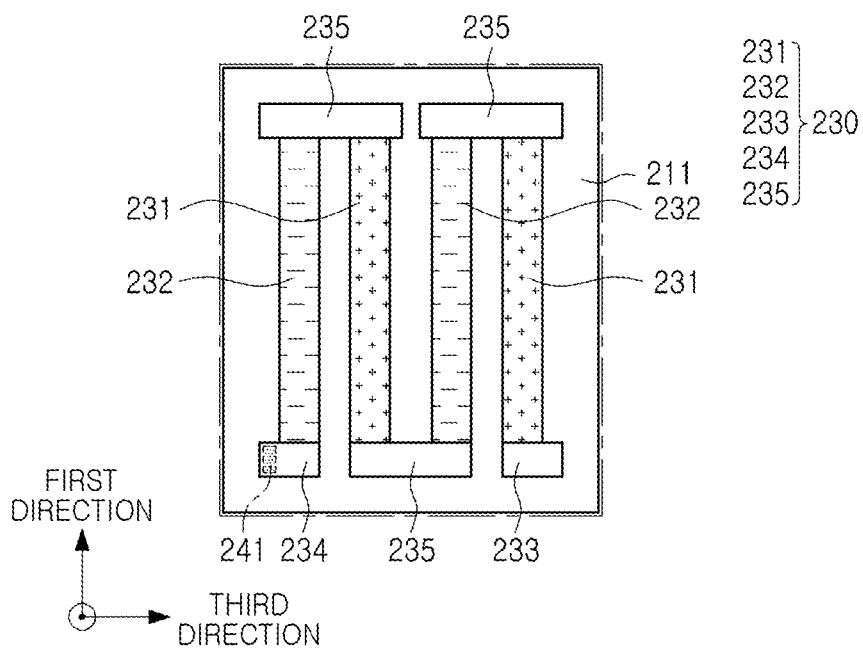

FIGS. 6A and 6B are plan views illustrating a thermoelectric element of a thermoelectric module according and a conductive via connected to the thermoelectric element in one plane to an exemplary embodiment in the present disclosure. That is, the insulating layer 211 through which the conductive vias 241 and 242 are disposed and the thermoelectric elements 220 and 230 stacked on the insulating layer 211 are illustrated on one plane, and the insulting layer 211 through which the conductive vias 241 and 242 are indicated by the alternated long and short dashed line and the stacked thermoelectric elements 220 and 230 are indicated by the solid line.

In an exemplary embodiment in the present disclosure, at least one of the plurality of thermoelectric elements 220 and 230 may include a plurality of first-type semiconductor devices 221 and 231, a plurality of second-type semiconductor devices 222 and 232, and a plurality of connection electrodes 225 and 235.

Referring to FIGS. 6A and 6B, at least one of the plurality of thermoelectric elements may include a first thermoelectric element 220 and a second thermoelectric element 230 adjacent to each other with the insulating layer 211 interposed therebetween, and the first and second thermoelectric elements 220 and 230 may include first-type semiconductor devices 221 and 231, second-type semiconductor devices 222 and 232, and a plurality of connection electrodes 225 and 235, respectively.

Accordingly, the thermoelectric elements 220 and 230 may form a plurality of unit cells in the same insulating layer 211 and realize high integration and miniaturization of the thermoelectric module by forming a higher level series connection within the same volume.

In this case, the plurality of first-type semiconductor devices 221 and 231 and the plurality of second-type semiconductor devices 222 and 232 are alternately disposed in one direction, and the plurality of connection electrodes 225 and 235 may be alternately disposed at one end and the other end of the first-type and second-type semiconductor devices in the one direction.

Referring to FIG. 6A, the first-type semiconductor device 221 and the second-type semiconductor device 222 of the first thermoelectric element 220 are alternately disposed in a third direction, and a plurality of connection electrodes 225 may be alternately disposed at one end and the other end of the first-type and second-type semiconductor devices 221 and 222 in the third direction.

Referring to FIG. 6B, the first-type semiconductor device 231 and the second-type semiconductor device 232 of the second thermoelectric element 230 are alternately disposed in the third direction, and a plurality of connection electrodes 235 may be alternately disposed at one end and the other end of the first-type and second-type semiconductor devices 231 and 232 in the third direction.

According to this structure, the plurality of connection electrodes 235 may be spaced apart from each other and connect a plurality of unit cells formed in the same insulating layer 211 to each other. Accordingly, high integration and miniaturization of the thermoelectric module may be realized by forming a higher level series connection within the same area of the insulating layer 211.

In addition, the first conductive via 241 of the thermoelectric elements 220 and 230 may connect the first electrode 223 of the first thermoelectric element 220 to the second electrode 234 of the second thermoelectric element 230. Also, the second conductive via 242 may connect the second electrode 224 of the first thermoelectric element 220 to the first electrode 233 of the second thermoelectric element 230.

Accordingly, the first-type semiconductor device 221 of the first thermoelectric element 220 may overlap the second-type semiconductor device 232 of the second thermoelectric element 230 in the stacking direction of the plurality of insulating layers 211, and the second-type semiconductor device 222 of the first thermoelectric element 220 may overlap the first-type semiconductor device 231 of the second thermoelectric element 230 in the stacking direction of the plurality of insulating layers 211.

Meanwhile, although it is illustrated in FIGS. 6A and 6B that the thermoelectric elements 220 and 230 include two first-type semiconductor devices 221 and 231 and two second-type semiconductor devices 222 and 232, respectively, the present disclosure is not limited thereto. That is, in consideration of the dimensions, manufacturing methods, etc. of each of the first and second-type semiconductor devices, the thermoelectric elements 220 and 230 may include three or more first-type semiconductor devices 221 and 231 and three or more second-type semiconductor devices 222 and 232, respectively.

FIGS. 7A to 7G are perspective views schematically illustrating a method for manufacturing a thermoelectric module according to another exemplary embodiment in the present disclosure.

The method for manufacturing a thermoelectric module according to another exemplary embodiment in the present disclosure may include: preparing a ceramic green sheet 311 on which a plurality of vias are formed; filling the vias with a conductive paste to form conductive vias 341 and 342; forming a plurality of thermoelectric elements 320 and at certain intervals on the ceramic green sheet 311; stacking the ceramic green sheet 311 on which the plurality of thermoelectric elements 320 and 330 are formed to form a stack 300; and cutting the stack 300 into regions each corresponding to one thermoelectric module and sintering the cut region to form a stack structure of a plurality of insulating layers, wherein the forming of the thermoelectric elements 320 and 330 may include forming first and second-type semiconductor devices 321, 322, 331, and 332; and forming first electrodes 323 and 333 connected to the first-type semiconductor devices 321 and 331, second electrodes 324 and 334 connected to the second-type semiconductor devices 322 and 332, and connection electrodes 325 and 335 connecting the first-type and second-type semiconductor devices 321, 322, 331, and 332.

Hereinafter, the method for manufacturing a thermoelectric module according to another exemplary embodiment in the present disclosure will be described in detail.

As shown in FIGS. 7A to 7G, a ceramic green sheet 311 having a plurality of vias formed therein is prepared.

The ceramic green sheet 311 is formed by preparing a slurry by mixing ceramic powder, a binder and a solvent and manufacturing the slurry in the form of a sheet having a thickness of several μm by a doctor blade method or the like. In particular, the ceramic powder preferably includes low temperature co-fired ceramics (LTCC), and may include fine ceramic powder particles to lower a sintering temperature.

Thereafter, the conductive vias 341 and 342 may be formed by filling the vias with a conductive paste. The via may be formed in the ceramic green sheet 311 by a laser etching method or punching, but the present disclosure is not limited thereto.

Next, a plurality of thermoelectric elements 320 and 330 may be formed on the ceramic green sheet 311 at certain intervals. First, the first-type semiconductor devices 321 and 331 and second-type semiconductor devices 322 and 332 may be formed on a ceramic green sheet 311. More specifically, the first-type semiconductor device 321 and the second-type semiconductor device 322 of the first thermoelectric element 320 may be formed on the first ceramic green sheet 311, and the first-type semiconductor device 331 and the second-type semiconductor device 332 of the second thermoelectric element 330 may be formed on a second ceramic green sheet 311.

The forming of the first-type semiconductor devices 321 and 331 and the second-type semiconductor devices 322 and 332 may be performed by a method for printing a first-type semiconductor slurry and a second-type semiconductor slurry on the ceramic green sheet 311, and may be performed by a screen-printing method, but the present disclosure is not limited thereto.

The first-type and second-type semiconductor slurries may be formed by mixing a thermoelectric material powder, a dispersant, and a solvent, and may further include a ceramic material to control a sintering temperature and a leveling agent to improve surface roughness. In addition, in order to control the sintering temperature, different thermoelectric material powders may be mixed and used. The dispersant may include a water-soluble dispersant such as polyvinyl pyrrolidone, and the solvent may include a solvent such as dimethylmethanamide, but the present disclosure is not limited thereto.

Next, the first electrodes 323 and 333 connected to the first-type semiconductor devices 321 and 331, the second electrodes 324 and 334 connected to the second-type semiconductor devices 322 and 332, and the connection electrodes 325 and 335 connecting the first-type and the second-type semiconductor devices may be formed.

The steps of forming the first electrodes 323 and 333, the second electrodes 324 and 334, and the connection electrodes 325 and 335 may be performed by printing a conductive paste on the ceramic green sheet 311, and may be performed by a screen-printing method or the like, but the present disclosure is not limited thereto.

Next, the stack 300 may be formed by stacking the ceramic green sheets 311 on which the plurality of thermoelectric elements 320 and 330 are formed. Here, as shown in FIGS. 7A to 7F, the first ceramic green sheet 311 on which the first thermoelectric element 320 is formed and the second ceramic green sheet 311 on which the second thermoelectric element 330 is formed may be alternately stacked. Accordingly, the first-type semiconductor device 321 of the first thermoelectric element 320 and the second-type semiconductor device 332 of the second thermoelectric element 330 may be alternately formed in the stacking direction (the second direction), and the second-type semiconductor device 322 of the first thermoelectric element 320 and the first-type semiconductor device 331 of the second thermoelectric element 330 may be alternately formed in the stacking direction (the second direction).

That is, the first electrode 323 of the first thermoelectric element 320 and the second electrode 334 of the second thermoelectric element 330 may be connected to each other by the first conductive via 341, and second electrode 324 of the first thermoelectric element 320 and the first electrode 333 of the second thermoelectric element 330 may be connected to each other by the second conductive via 342.

Figure 7A:
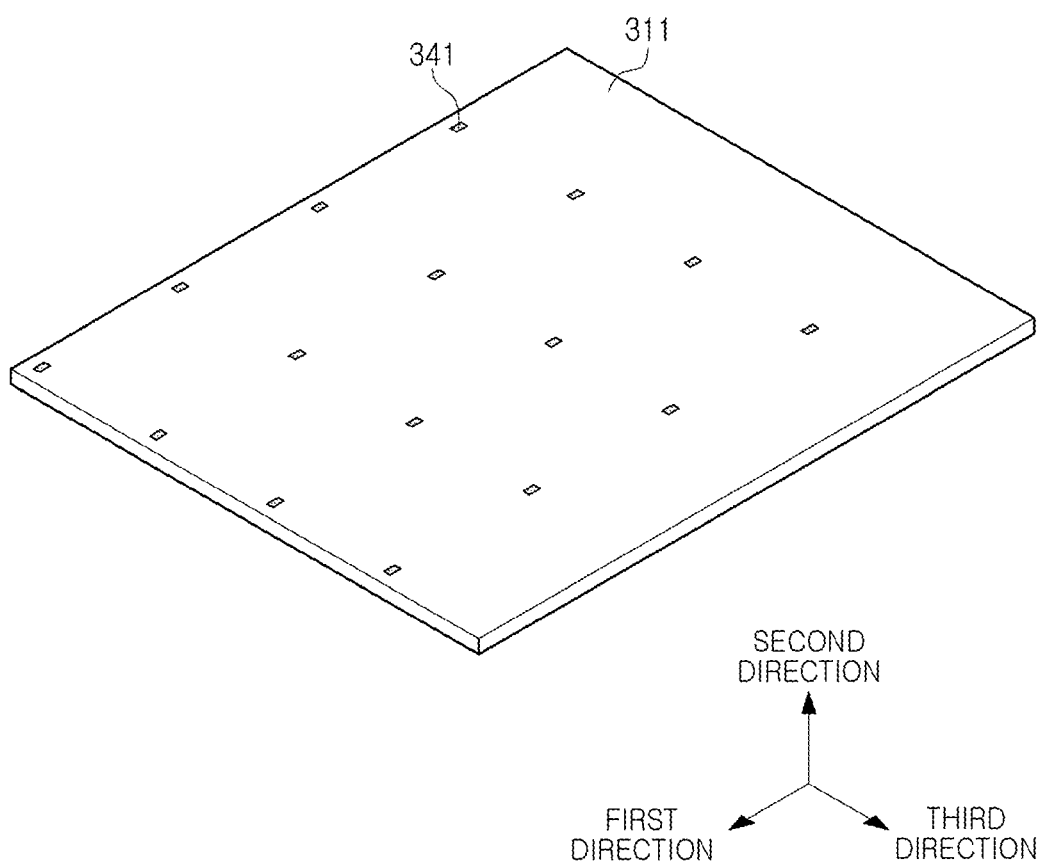
FIGS. 7A, 7B, 7C, 7D, 7E, 7F, and 7G are perspective views schematically illustrating a method for manufacturing a thermoelectric module according to another exemplary embodiment in the present disclosure.
Figure 7B:
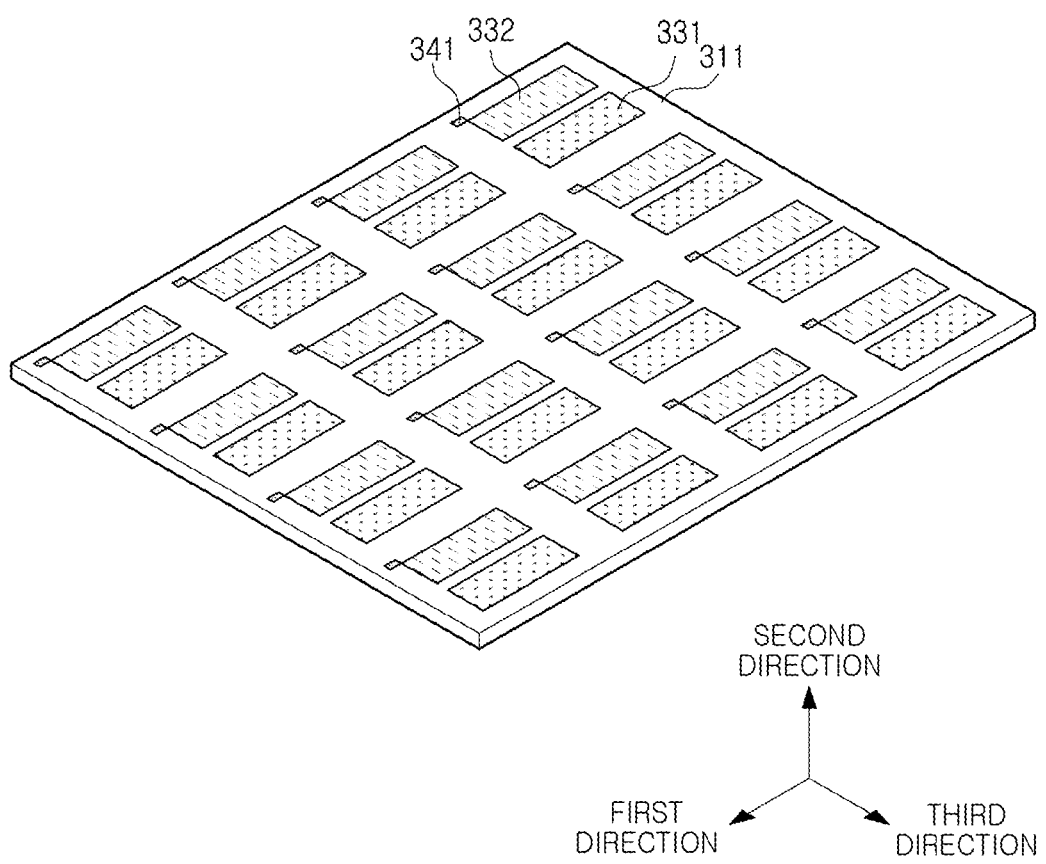
Figure 7C:
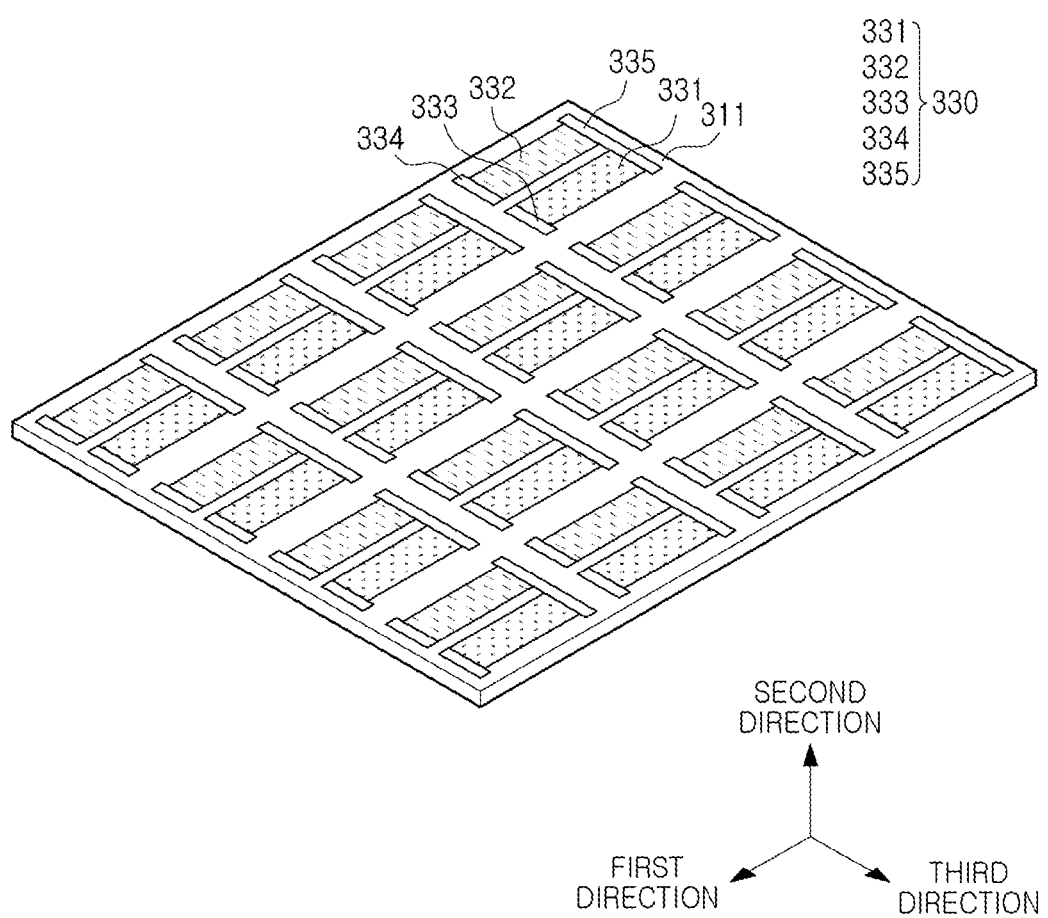
Figure 7D:
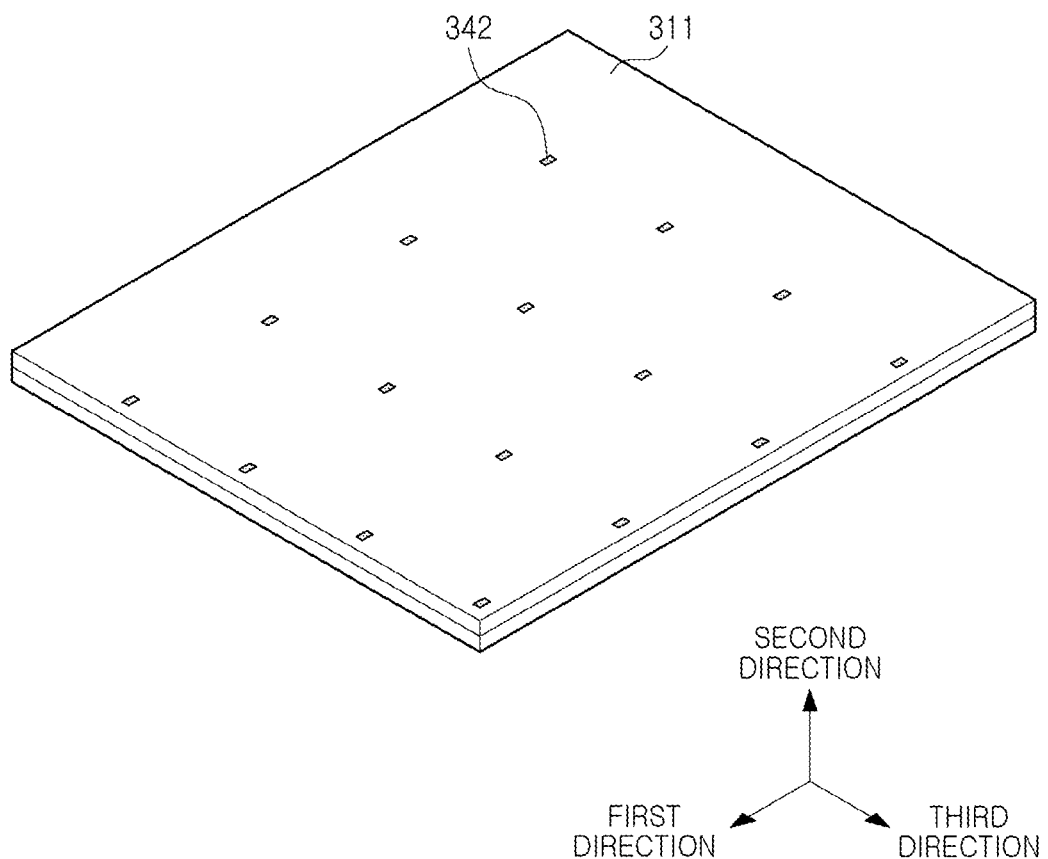
Figure 7E:
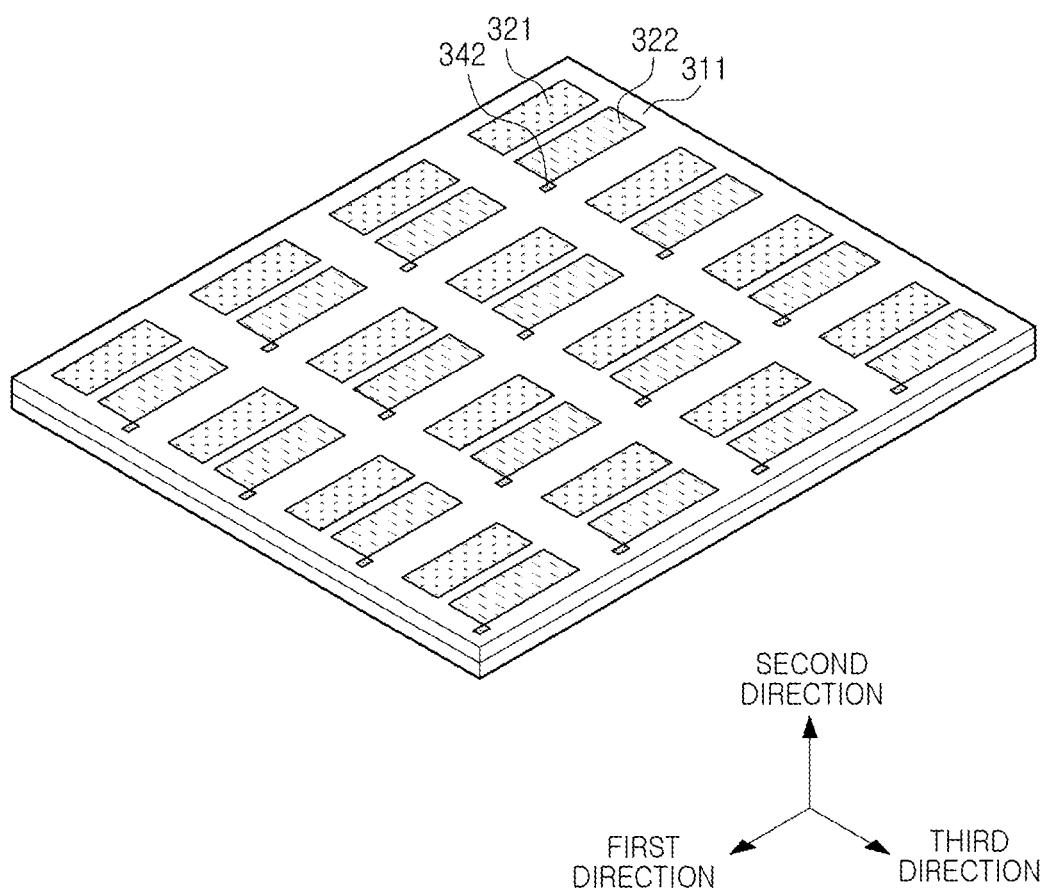
Figure 7F:
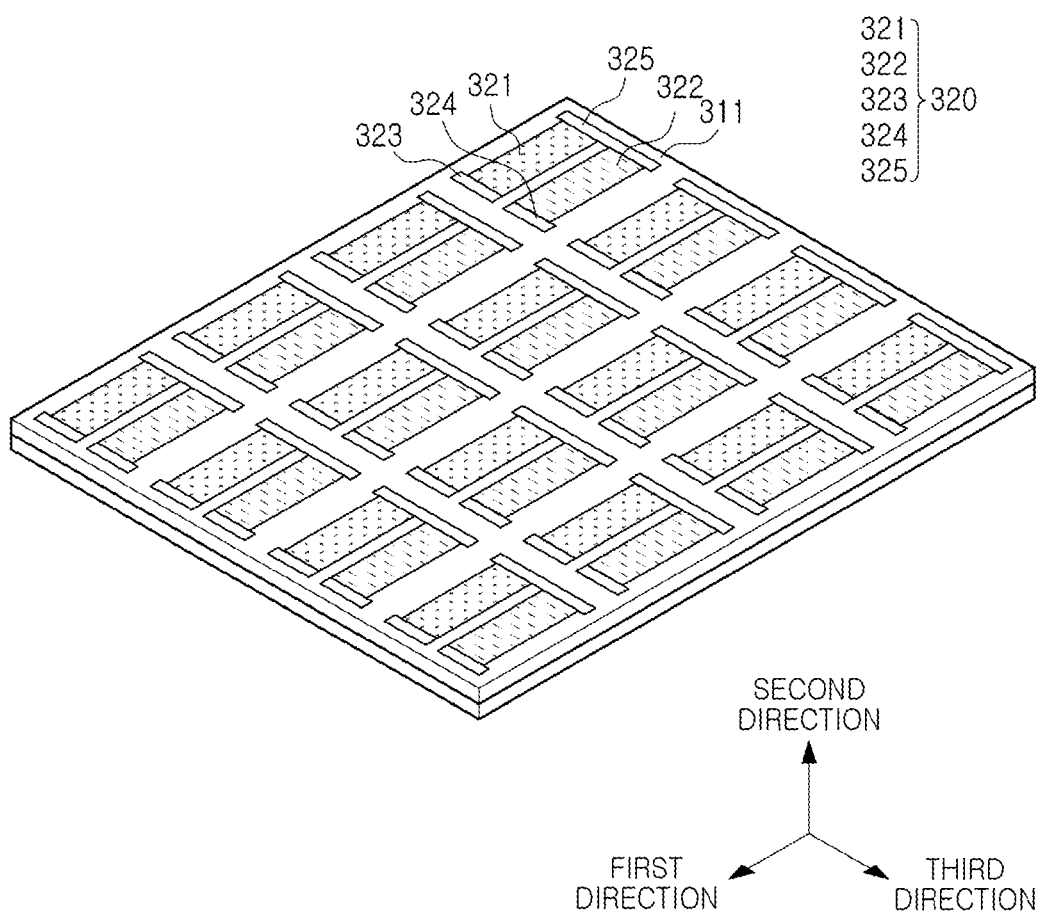
Figure 7G:
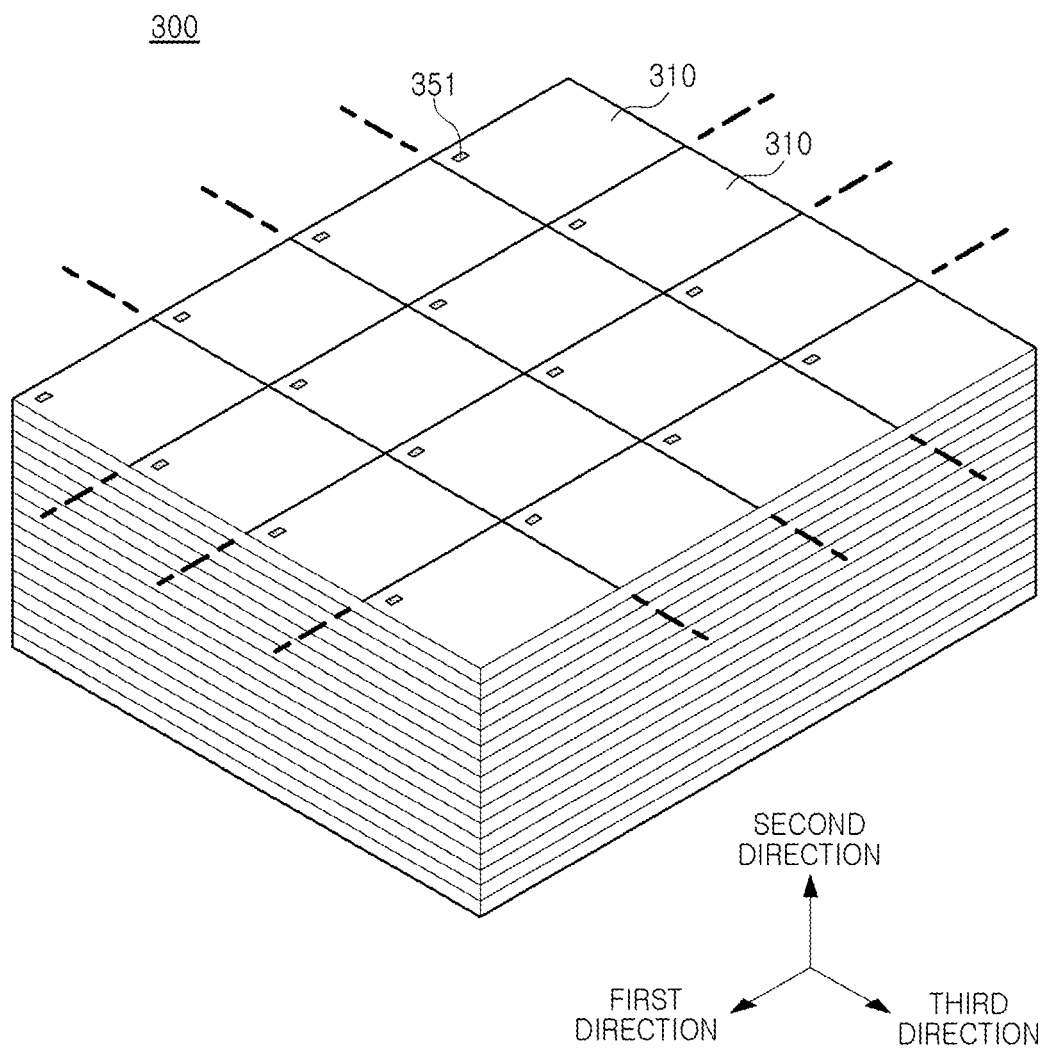

In this case, referring to FIG. 7G, among the first and second conductive vias 341 and 342, a first connection via 351 and a second connection via (not shown) disposed at the outermost side in the stacking direction (the second direction) may be included. The first connection via 351 and the second connection via (not shown) have the same configuration as the conductive vias 341 and 342 and may be formed by the same process, except that they are disposed on the outermost side in the stacking direction to be connected to the external electrode.

Next, referring to FIG. 7G, the stack 300 may be cut into regions each corresponding to a single thermoelectric module and fired to form a stack structure of a plurality of insulating layers. That is, by sintering the plurality of stacked chips 310 formed by cutting the stack 300, the stack structure 110 of the plurality of insulating layers 111, the plurality of thermoelectric elements 120 and 130, and the conductive vias 141 and 142 may be formed. That is, the thermoelectric elements 120 and 130 and the insulating layer 111 may be simultaneously sintered.

In this case, the sintering temperature may be a temperature at which the ceramic green sheet, the semiconductor slurry, and the conductive paste are simultaneously sintered and may be, for example, 350 to 600° C., but the present disclosure is not limited thereto.

In addition, cold sintering or spark plasma sintering may be used to control the sintering temperature, but the present disclosure is not limited thereto.

In an exemplary embodiment in the present disclosure, the method may further include forming the first and second external electrodes 161 and 162 on both surfaces of the stack structure 110 facing in the stacking direction (the second direction). The first and second external electrodes 161 and 162 may be formed by applying a conductive paste to the stack structure 110 and then performing drying and sintering, but the present disclosure is not limited thereto, and the first and second external electrodes 161 and 162 may also be formed using an electroless plating method or a sputtering method. Also, the first and second external electrodes 161 and 162 may extend to a lower surface of the stack structure 110.

In addition, descriptions of the same parts as those in the exemplary embodiment in the present disclosure described above will be omitted here in order to avoid repetition.

As set forth above, one of several effects of the present disclosure is to realize a chip-type thermoelectric module to achieve high integration and miniaturization of the thermoelectric module.

One of several effects of the present disclosure is to prevent defects such as cracks and joint separation by improving the mechanical strength of the thermoelectric module.

One of several effects of the present disclosure is to solve the problem in which the performance of the thermoelectric module is deteriorated at a high temperature.

While example exemplary embodiments have been shown and described above, it will be apparent to those skilled in the art that modifications and variations could be made without departing from the scope of the present disclosure as defined by the appended claims.

What is claimed is:

1. A thermoelectric module comprising:
a stack structure including an insulating layer and a plurality of thermoelectric elements with the insulating layer interposed therebetween in a stacking direction such that all thermoelectric elements of the stack structure are embedded within the insulating layer, the plurality of thermoelectric elements each including a first-type semiconductor device, a second-type semiconductor device, a first electrode connected to the first-type semiconductor device and spaced apart from the second-type semiconductor devices of the plurality of thermoelectric elements, a second electrode connected to the second-type semiconductor device and spaced apart from the first-type semiconductor devices of the plurality of thermoelectric elements, and a connection electrode connecting the first-type and second-type semiconductor devices;
first and second external electrodes respectively disposed on first and second surfaces of the stack structure to overlap each other in the stacking direction, and respectively connected to one of the first and second electrodes; and
a conductive via penetrating through the insulating layer to connect a first-type semiconductor device to a second-type semiconductor device of respective thermoelectric elements adjacent to each other, among the plurality of thermoelectric elements.

2. The thermoelectric module of claim 1, wherein
the plurality of thermoelectric elements include a first thermoelectric element and a second thermoelectric element adjacent to each other with the insulating layer interposed therebetween, and
the conductive via connects a first electrode of the first thermoelectric element to a second electrode of the second thermoelectric element, and connects a second electrode of the first thermoelectric element to a first electrode of the second thermoelectric element.

3. The thermoelectric module of claim 1, wherein
the plurality of thermoelectric elements include a first thermoelectric element and a second thermoelectric element adjacent to each other with the insulating layer interposed therebetween, and
the first-type semiconductor device of the first thermoelectric element overlaps the second-type semiconductor device of the second thermoelectric element in the stacking direction, and
the second-type semiconductor device of the first thermoelectric element overlaps the first-type semiconductor device of the second thermoelectric element in the stacking direction.

4. The thermoelectric module of claim 1, wherein the first-type semiconductor device is a P-type semiconductor device, and the second-type semiconductor device is an N-type semiconductor device.

5. The thermoelectric module of claim 1, wherein the conductive via is disposed on the same plane as that of the insulating layer.

6. The thermoelectric module of claim 1, wherein the insulating layer is a ceramic sintered body.

7. The thermoelectric module of claim 6, wherein the plurality of thermoelectric elements are simultaneously sintered with the insulating layer.

8. The thermoelectric module of claim 1, further comprising:
a first connection via penetrating through the insulating layer to connect the first electrode to the first external electrode; and
a second connection via penetrating through the insulating layer to connect the second electrode to the second external electrode.

9. The thermoelectric module of claim 1, wherein the first and second external electrodes extend to a lower surface of the stack structure which connects first and second surfaces of the stack structure facing each other in the stacking direction.

10. The thermoelectric module of claim 1, wherein the first electrode, the second electrode, the connection electrode, and the conductive via include any one selected from the group consisting of Ag, Al, Cu, Ni, and alloys thereof.

11. The thermoelectric module of claim 1, wherein at least one of the plurality of thermoelectric elements includes a plurality of first-type semiconductor devices, a plurality of second-type semiconductor devices, and a plurality of connection electrodes.

12. The thermoelectric module of claim 11, wherein
the plurality of first-type semiconductor devices and the plurality of second-type semiconductor devices are alternately disposed in one direction, and
the plurality of connection electrodes are alternately disposed at two adjacent ends of the first-type and second-type semiconductor devices.

13. A thermoelectric module comprising:
a ceramic body including first and second thermoelectric elements and an insulating layer interposed therebetween in a stacking direction, wherein:
each of the first and second thermoelectric elements comprises a first-type semiconductor device, a second-type semiconductor device, a first electrode connected to the first-type semiconductor device and spaced apart from the second-type semiconductor device of the first and second thermoelectric elements, a second electrode connected to the second-type semiconductor device and spaced apart from the first-type semiconductor device of the first and second thermoelectric elements, and a connection electrode connecting the first-type and second-type semiconductor devices, the first and second thermoelectric elements are electrically connected to each other in series, the first-type semiconductor device of the first thermoelectric element overlaps the second-type semiconductor device of the second thermoelectric element in the stacking direction, and the second-type semiconductor device of the first thermoelectric element overlaps the first-type semiconductor device of the second thermoelectric element in the stacking direction.

14. The thermoelectric module of claim 13, wherein the ceramic body includes a plurality of first thermoelectric elements and a plurality of second thermoelectric elements alternately connected to each other in the stacking direction, and a plurality of insulating layers each interposed between an adjacent pair of the first and second thermoelectric elements.

15. The thermoelectric module of claim 14, wherein, among the plurality of first and second thermoelectric elements, the second electrode of the first thermoelectric element is connected to the first electrode of the second thermoelectric element by a first conductive via penetrating through the insulating layer, the second electrode of the second thermoelectric element is connected to a first electrode of another first thermoelectric element by a second conductive via penetrating through another insulating layer, and the first and second conductive vias do not overlap each other in the stacking direction.

16. The thermoelectric module of claim 15, wherein each of the first and second conductive vias is disposed on the same plane as that of the corresponding insulating layer.

17. The thermoelectric module of claim 15, wherein:

the first-type and second-type semiconductor devices connect the first and second electrodes to the connection electrode, respectively, in a thickness direction, and the connection electrode connects the first-type and second-type semiconductor devices in a width direction, and each of the first and second conductive vias does not overlap the first-type and second-type semiconductor devices in any of the stacking direction, thickness, and width directions.

18. The thermoelectric module of claim 13, wherein the first-type semiconductor device is a P-type semiconductor device, and the second-type semiconductor device is an N-type semiconductor device.

19. The thermoelectric module of claim 13, further comprising first and second external electrodes respectively disposed on first and second surfaces of the ceramic body facing each other in the stacking direction.

20. The thermoelectric module of claim 19, further comprising:

a first connection via penetrating through an insulating layer to connect the first electrode to the first external electrode; and a second connection via penetrating through an insulating layer to connect the second electrode to the second external electrode.

21. The thermoelectric module of claim 13, wherein each of the first and second thermoelectric elements is embedded within the insulating layer, and wherein first and second external electrodes are respectively disposed on first and second surfaces of the ceramic body to overlap each other in the stacking direction, and respectively connected to one of the first and second electrodes.

* * * * *